United States Patent
Maruyama et al.

[11] Patent Number: 5,932,926
[45] Date of Patent: Aug. 3, 1999

[54] MICROWAVE SEMICONDUCTOR INTEGRATED CIRCUIT

[75] Inventors: Takaya Maruyama; Takahide Ishikawa; Noriyuki Tanino, all of Tokyo, Japan

[73] Assignee: Mitsubishi Denki Kabushiki Kaisha, Tokyo, Japan

[21] Appl. No.: 08/795,790

[22] Filed: Feb. 5, 1997

[30] Foreign Application Priority Data

Sep. 3, 1996 [JP] Japan .................................. 8-232866

[51] Int. Cl.⁶ .................................................. H01L 23/34
[52] U.S. Cl. ............................................ 257/728; 257/275
[58] Field of Search ................................. 257/275, 728, 257/276, 277, 773; 332/243

[56] References Cited

U.S. PATENT DOCUMENTS 5,138,436  8/1992  Koepf ...................................... 257/728
5,608,263  3/1997  Drayton et al. ......................... 257/728

FOREIGN PATENT DOCUMENTS 6125208  5/1994  Japan .

Primary Examiner—Peter Toby Brown
Assistant Examiner—Roy Potter
Attorney, Agent, or Firm—Leydig, Voit & Mayer, Ltd.

[57] ABSTRACT

A microwave semiconductor integrated circuit having high isolation includes a wiring-side substrate including a transmission line in slots at a surface; an element-side substrate having an active element on a surface, the transmission line being embedded in the wiring-side substrate; and metal bumps electrically connecting the transmission line embedded in the wiring-side substrate to electrodes of the active element on the element-side substrate. Therefore, a connection between a transmission line and electrodes of an element, such as an FET or the like, can be easily realized without being affected by a difference in positional level between the transmission line and the electrodes. In addition, the element on the element-side substrate is not adversely affected by the subsequent fabrication of the slots and wiring layers and, therefore, the reliability of the integrated circuit is not adversely affected. Furthermore, since the element and the transmission line are mounted on separate substrates, focusing is easy during the exposure for forming masks used for etching the slots and wiring layers in the wiring-side substrate because there is no unevenness within the substrate surface, facilitating the fabrication of masks.

7 Claims, 9 Drawing Sheets

MICROWAVE SEMICONDUCTOR INTEGRATED CIRCUIT

FIELD OF THE INVENTION

The present invention relates to a microwave semiconductor integrated circuit and a method for fabricating the microwave semiconductor integrated circuit and, more particularly, to a circuit structure having improved isolation between microwave transmission lines and a method for fabricating such a structure.

BACKGROUND OF THE INVENTION

FIG. 18 is a plan view illustrating an instance of a high-isolation microwave semiconductor integrated circuit (high-isolation MIC) formed by technologies described in Japanese Non-examined Patent Publication No. 6-125208 which has been disclosed by the inventor of the present invention. The microwave semiconductor integrated circuit features an embedded line structure with a transmission line embedded in a substrate. FIG. 19 is a cross-sectional view taken along a line 19—19 of FIG. 18. In the figures, reference numeral 10 designates a semiconductor substrate made of GaAs or InP, numeral 10a designates a slot formed at a region in which a transmission line 17 is to be formed on a surface of the semiconductor substrate 10. In the slot 10a, a conductor plate 7 is disposed to overlie the side and bottom surfaces of the slot 10a so that the conductor plate is U-shaped in cross-section. A dielectric 9 is disposed on the bottom area of the conductor plate 7, and a microstrip line 8 is disposed on the dielectric 9.

Thus, the transmission line 17 in a slot 10a of the semiconductor substrate 10 comprises the conductor plate 7, the microstrip line 8, and the dielectric 9 which is sandwiched between the conductor plate 7 and the microstrip line 8.

Reference numeral 1 designates an input terminal pad formed at one end of an input-side microstrip line 8a, numeral 2 designates an output terminal pad formed at one end of an output-side microstrip line 8b, numeral 3 designates a FET fabricated on a surface of the semiconductor substrate 10, numeral 4 designates a gate connecting electrode of the FET 3 that is connected to the other end of the input-side microstrip line 8a connected to the input terminal 1, numeral 5 designates a drain connecting electrode that is connected to the other end of the output-side microstrip line 8b connected to the output terminal 2, and numeral 6 designates a source connecting electrode of the FET 3. Since there is a difference in positional level between the semiconductor surface where the FET 3 is formed and the embedded microstrip line 8 in the slot 10a, the gate connecting electrode 4 and the drain connecting electrode 5 of the FET 3 are connected to the input-side microstrip line 8a and the output-side microstrip line 8b by gold wires 159, respectively.

Thus, the transmission line 17 formed in the slot 10a of the semiconductor substrate 10 has a structure such that the conductor plate 7 is disposed at both sides of the microstrip line 8, and this structure inhibits the leakage of electromagnetic waves in the lateral direction. Therefore, crosswalk hardly occurs even if a plurality of lines are arranged in proximity of each other, and the structure has high isolation.

In the prior art microwave semiconductor integrated circuit having the aforesaid structure, the transmission line is disposed in the slot on the substrate surface and the slot is covered with a conductor, and therefore the leakage of electromagnetic waves in the lateral direction is inhibited. However, it is difficult to connect the lines on the bottom surfaces of the slots of the substrate to the connecting electrodes of the element such as an FET formed on the surface of the substrate because of the difference in positional level between the lines and the electrodes. In addition, since the slots and other elements constituting a transmission line are formed on a single substrate where an element such as an FET has been formed, the existing element is damaged and the reliability of the circuit is deteriorated. Furthermore, when this embedded transmission line is formed on a surface of a semiconductor substrate where an element such as FET has been formed, there occurs a considerable unevenness on the surface of the substrate. Hence, different focuses are obtained during exposure to produce the masks necessary for etching slots and wiring layers, whereby it is difficult to fabricate the masks with high accuracy.

SUMMERY OF THE INVENTION

It is an object of the present invention to provide a microwave semiconductor integrated circuit capable of being fabricated with high accuracy in a simple fabrication process with less damage to the elements, and an appropriate method for fabricating such a device.

Other objects and advantages of the invention will become apparent from the detailed description that follows. The detailed description and specific embodiments described are provided only for illustration since various additions and modifications within the scope of the invention will be apparent to those of skill in the art from the detailed description.

A microwave semiconductor integrated circuit having high isolation according to a first aspect of the present invention comprises: a wiring-side substrate comprising a transmission line in slots formed on a surface; an element-side substrate having an active element on a surface; and metal bumps which electrically connect the transmission line embedded in the wiring-side substrate and the leading electrodes of the active element on the element-side substrate. Therefore, a connection between a transmission line and electrodes of an element such as FET or the like can be easily realized without being affected by a difference in positional level between the transmission line and the electrodes shown in the prior art integrated circuit. In addition, the element on the element-side substrate is not be adversely affected by the subsequent fabrication of the slots and wiring layers, and therefore the reliability of the integrated circuit is not deteriorated. Furthermore, since the element and the transmission line are formed on separate substrates, focusing is easily obtained in the exposure for forming masks used for etching the slots and wiring layers in the wiring-side substrate because there is no unevenness within the substrate surface, thereby facilitating the fabrication of the masks.

According to a second aspect of the present invention, in the microwave semiconductor integrated circuit described as the first aspect of the present invention, the element-side substrate comprises a conductor formed over a surface opposite the substrate surface where the active element is formed, and via-holes through which the electrodes of the active element are connected to the conductor on the opposite side. The wiring-side substrate comprises a conductor formed over a surface where the transmission lines are formed. The transmission line in the wiring-side substrate and the electrodes of the active element on the element-side substrate are electrically connected by electrically connecting the transmission line in the wiring-side substrate to the via-holes of the element-side substrate by means of the metal bumps, with a surface of the element-side substrate over which the conductor is formed and a surface of the wiring-side substrate over which the conductor is formed facing each other. As a result, the conductor plate of the element-side substrate is placed in proximity to the slots of the wiring-side substrate in which the transmission line is formed, and the transmission line comprises microstrip lines which look as if they were enclosed by a conductor, respectively. Therefore, the leakage of an electromagnetic wave in the longitudinal direction as well as the lateral direction is inhibited, and the transmission line can have high isolation.

According to a third aspect of the present invention, in the microwave semiconductor integrated circuit described as the first aspect of the present invention, the wiring-side substrate comprises a conductor formed over a surface where the transmission line is formed, and the transmission line on the wiring-side substrate and the electrodes of the active element on the element-side substrate are electrically connected by the metal bumps, with the surface of the element-side substrate on which the active element is formed and the surface of the wiring-side substrate over which the conductor is formed facing each other. Therefore, a common flip-chip type semiconductor substrate is applicable in the microwave semiconductor integrated circuit, and the conventional flip-chip type substrate can constitute the integrated circuit.

According to a fourth aspect of the present invention, in the microwave semiconductor integrated circuit described as the first aspect of the present invention, the metal bump comprises an insulating layer over a side surface. Therefore, a conductive part such as a conductor surrounding the metal bump is prevented from making contact with the metal bump, whereby the short circuit of the wiring is inhibited.

According to a fifth aspect of the present invention, in the microwave semiconductor integrated circuit described as the fourth aspect of the present invention, the metal bump with the insulating layer has a diameter approximately equal to the width of the slot formed in the wiring-side substrate, and the metal bump is inserted into the slot to establish an electric connection to the transmission line. Therefore, the alignment between the microstrip line on the bottom surface of the slot for wiring and the metal bump is easily performed, whereby the short-circuit resulting from the misalignment is inhibited.

According to a sixth aspect of the present invention, in the microwave semiconductor integrated circuit described as the fourth aspect of the present invention, the metal bump with the insulating layer comprises a metal part having a diameter approximately equal to the width of the respective electrodes of the active element on the element-side substrate. Therefore, the alignment between the microstrip line disposed at the bottom surface of the slot for wiring and the metal bump is performed with ease, and the alignment between the respective terminals on the element-side substrate and the metal bump also is easily performed, whereby the short-circuit resulting from the misalignment is inhibited with further reliability.

According to a seventh aspect of the present invention, in the microwave semiconductor integrated circuit described as the first aspect of the present invention, the wiring-side substrate comprises a first wiring-side substrate comprising a conductor overlying a surface opposite the surface of the wiring-side substrate where a transmission line is formed, and via-holes through which the conductor is electrically connected to the conductor over the element-side surface; and a second wiring-side substrate comprising a transmission line that is electrically connected to the conductor of the first wiring-side substrate formed over a surface opposite the substrate surface where the transmission line formed on the first wiring-side substrate by means of gold bumps. Therefore, since the wiring-side substrate has a multi-layer structure, the flexibility in circuit designing is increased. In addition, the multi-layer structure allows the chip size reduction without changing the length of the wiring.

According to an eighth aspect of the present invention, in the microwave semiconductor integrated circuit described as the first aspect of the present invention, the wiring-side substrate is formed by disposing a plurality of split substrates having conductors on their surfaces at prescribed positions on a ground substrate, and successively bonding a conductor, a dielectric, and a microstrip line to form a wiring layer in each of slot areas between adjacent split substrates. Therefore, the wiring-side substrate with an embedded type transmission line can be fabricated mechanically without employing a wafer process.

According to a ninth aspect of the present invention, in the microwave semiconductor integrated circuit described as the first aspect of the present invention, the wiring-side substrate comprises metal conductor. As a result, an advantage is achieved that the thermal dissipation effect of the wiring-side substrate is increased.

According to a tenth aspect of the present invention, in a method of fabricating a microwave semiconductor integrated circuit which comprises an element-side substrate including an active element and a wiring-side substrate including a transmission line, the transmission line of the wiring-side substrate being electrically connected to the electrodes of the active element of the element-side substrate by means of metal bumps, the wiring-side substrate is formed by applying an adhesive over a surface of a ground substrate, successively bonding dielectrics, wiring layers serving as microstrip lines in the slot areas between adjacent split substrates. Therefore, unlike the conventional fabrication system, a wiring-side substrate having an embedded transmission line is mechanically fabricated without employing wafer process. As a result, the fabrication system is simplified, and the cost for the fabrication is reduced.

According to an eleventh aspect of the present invention, in the method of fabricating a microwave semiconductor integrated circuit which comprises an element-side substrate including an active element and a wiring-side substrate including a transmission line, the transmission line being electrically connected to the electrodes of the active element by means of metal bumps, the metal bump with an insulating layer around is formed by coating an outside of a gold line with an insulating film, and then cutting the gold line with an insulating layer around into the metal bumps of prescribed height. Therefore, the metal bump comprising an insulating film around can be fabricated in a simple method.

DETAILED DESCRIPTION OF THE PREFERRED EMBODIMENTS

Embodiment 1

Figure 1:
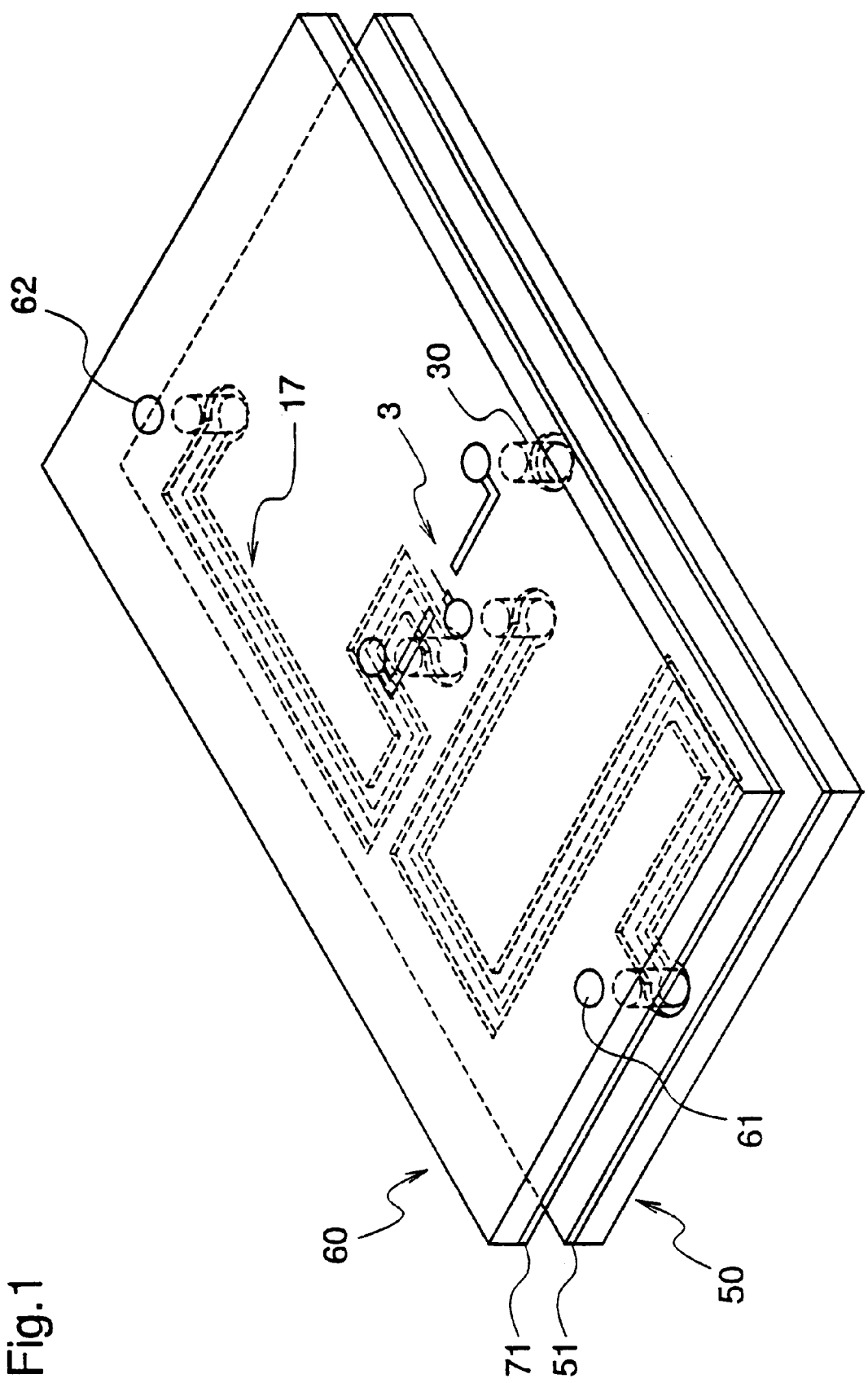
FIG. 1 is a perspective view illustrating a structure of a microwave semiconductor integrated circuit according to a first embodiment of the present invention.

FIG. 1 is a perspective view showing a structure of a microwave semiconductor integrated circuit according to a first embodiment of the present invention. As shown in the figure, an element-side substrate 60 on which FET 3 is present is placed opposite a wiring-side substrate 50 in which a transmission line 17 is formed, and electrical connections between the substrates 50 and 60 are established by gold bumps 30.

Figure 5:
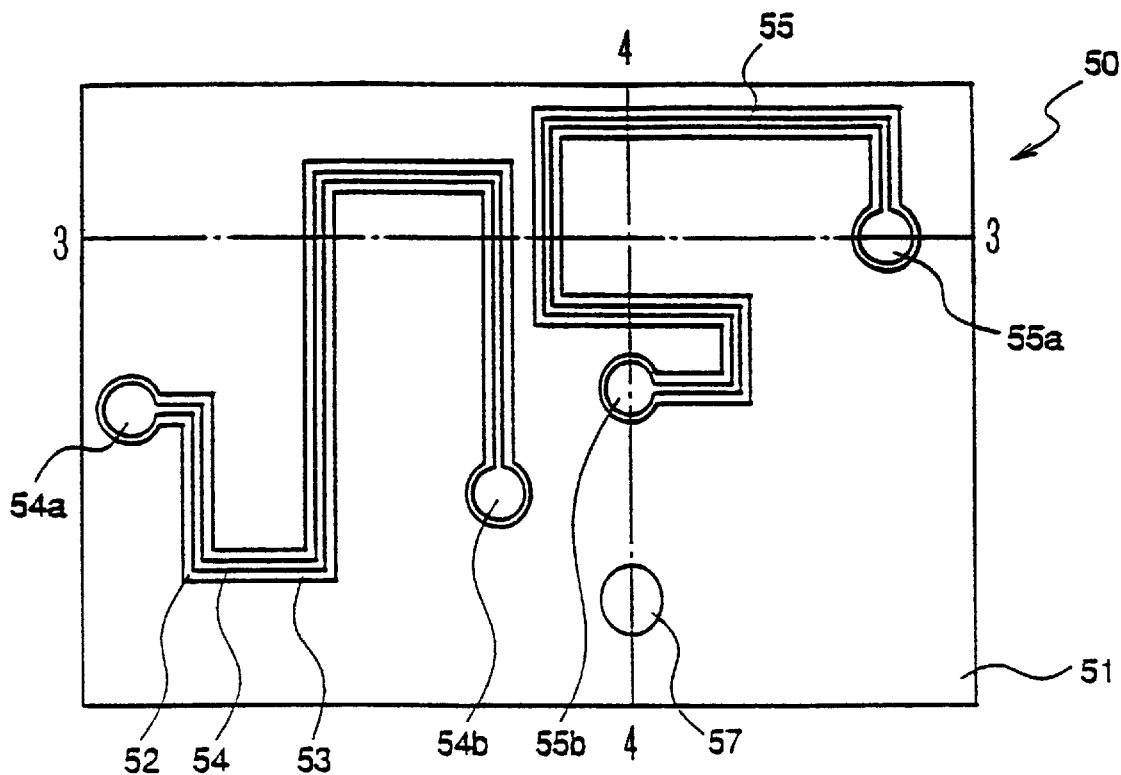
FIG. 5 is a plan view illustrating a wiring-side substrate of the microwave semiconductor integrated circuit according to the first embodiment of the present invention.

In FIG. 5, slots for wiring 52, 20 to 50 $\mu$m deep, are disposed along a region where a transmission line 17 is to be formed on, for example, a 100 $\mu$m thick GaAs substrate, and a conductor plate 51 having a few micrometer thickness is disposed over a substrate surface including the surfaces of the slots. An input-side microstrip line 54 and an output-side microstrip line 55 are disposed on the bottoms of the respective slots for wiring 52 with interposed dielectrics 53 made of polyimide or the like. Thus, the microstrip lines 54 and 55, the dielectrics 53, and the conductor plate 51 constitute the transmission line 17. An input terminal pad 54a is disposed at one end of the input-side microstrip line 54, and a gate electrode pad 54b is disposed at the other end of the input-side microstrip line 54. A drain electrode pad 55a is disposed on one end of the output-side microstrip line 55 and an output terminal pad 55b is disposed at the other end of the output-side microstrip line 55.

Figure 4:
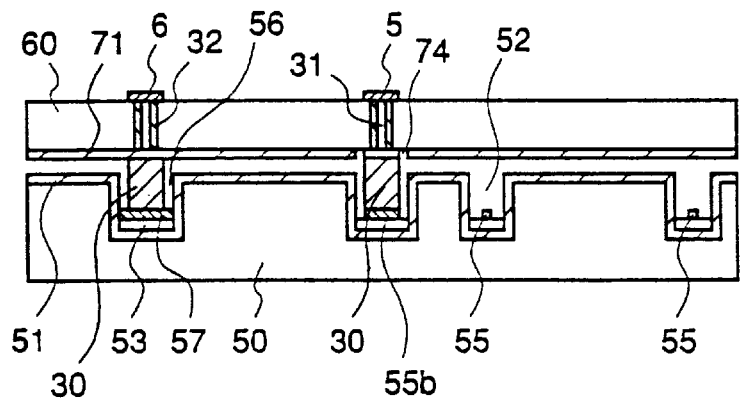
FIG. 4 is a sectional side view of the microwave semiconductor integrated circuit according to the first embodiment taken along the line 4—4 of FIG. 5.

On the wiring-side substrate 50, as shown in FIG. 4, a recess for source electrode 56 is also provided at a region where a source electrode pad is to be formed, and a conductor plate 51 is disposed over the inside of the recess for source electrode 56. Moreover, a source electrode pad layer 57 of the same material as those of the input-side microstrip line 54 and the output-side microstrip line 55 is disposed on the bottom of the recess for source electrode 56 with an interposed dielectric 53, as in the case of the slots for wiring 52. The conductor plate 51 is directly formed over the inside of the recess for source electrode 56 because the source electrode is desired to be connected to the conductor plate 51. This structure, however, causes a difference in positional level between the gold bumps 30 which connect the wiring-side substrate 50 and the element-side substrate 60, and a correction process is required for adjustment of the heights of the gold bumps 30, resulting in a complicated fabrication process of the circuit. Therefore, as described above, when the source electrode pad layer 57 is provided in the recess for source electrode 56 with the dielectric 53, the adjustment of the positional level of the bumps can be easily effected with no additional process step to the fabrication process of the circuit.

Figure 6:
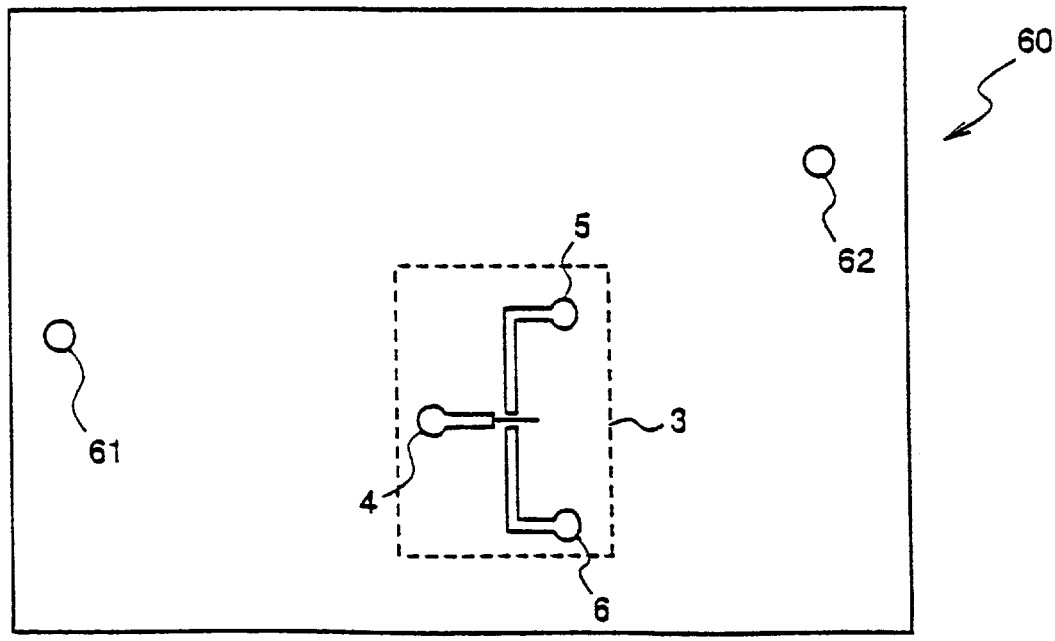
FIG. 6 is a plan view illustrating a surface of an element-side substrate of the microwave semiconductor integrated circuit according to the first embodiment. A FET is formed on the surface.
Figure 7:
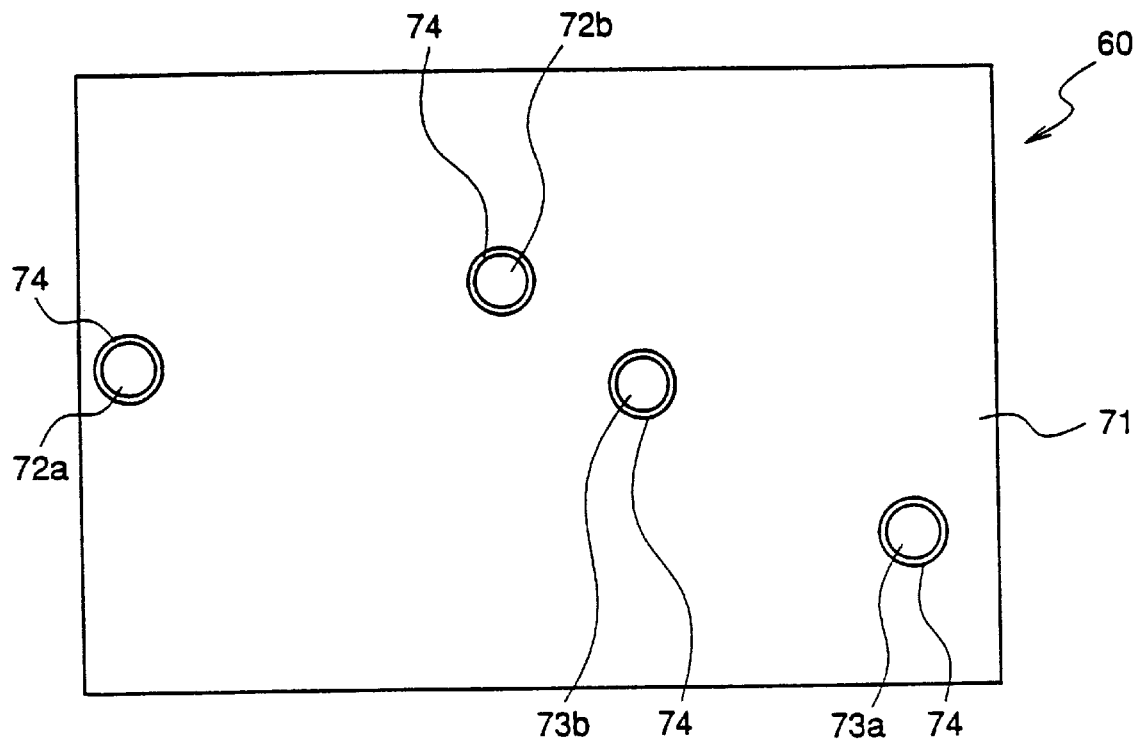
FIG. 7 is a plan view illustrating a surface of the element-side substrate of the microwave semiconductor integrated circuit of the first embodiment. A conductor plate is formed over the surface.

As shown in FIG. 6, the element-side substrate 60, e.g., a 100 $\mu$m thick GaAs substrate, comprises an FET on a surface, and its gate connecting electrode 4, drain connecting electrode 5, and source electrode 6 are disposed in predetermined positions. Input terminal 61 and output terminal 62 are disposed near the perimeter of the element-side substrate 60. Moreover, as shown in FIG. 7, a conductor plate 71 is disposed over the opposite surface of the element-side substrate 60, and the pads 72b, 73b, 72a, and 73a are respectively disposed in positions corresponding to the positions of the gate connecting electrode 4, drain connecting electrode 5 of the FET 3, the input terminal 61, and the output terminal 62. The respective pads 72b, 73b, 72a, and 73a are electrically isolated from the conductor plate 71 by ring-shaped clearances 74. Moreover, the gate connecting electrode 4, the drain connecting electrode 5, the input terminal 61, and the output terminal 62 are electrically connected to the pads 72b, 73b, 72a, and 73a through conductors 32 which are formed on the interior surface of via-holes 31 by plating, which via-holes 31 extend through the element-side substrate 60 (shown in FIGS. 3 and 4). The source connecting electrode 6 is directly connected to the conductor plate 71 through a conductor 32 formed on an interior surface of a via-hole 31 by plating, which via-hole extends through the element-side substrate 60, as shown in FIG. 4.

Figure 2:
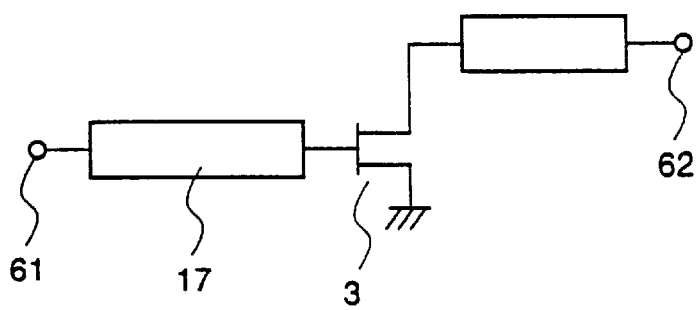
FIG. 2 is a equivalent circuit diagram of the microwave semiconductor integrated circuit according to the first embodiment of the present invention.
Figure 3:
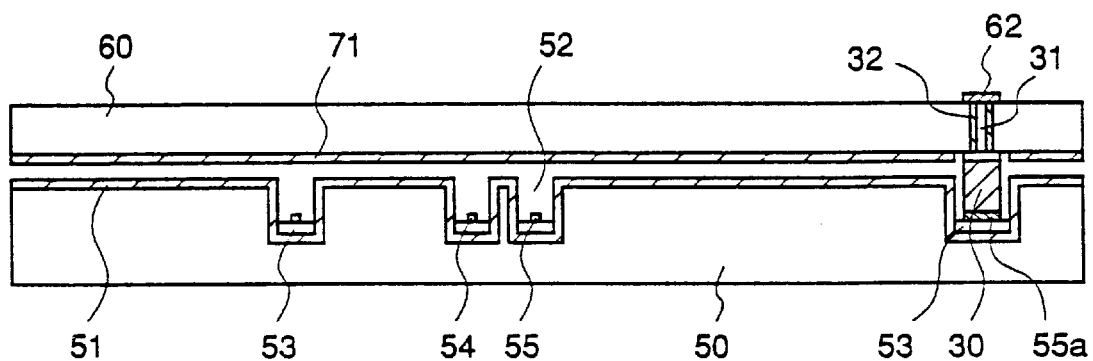
FIG. 3 is a sectional side view of the microwave semiconductor integrated circuit according to the first embodiment taken along the line 3—3 of FIG. 5.

FIG. 3 is a cross-sectional view taken along a line 3—3 of FIG. 5, and FIG. 4 a cross-sectional view taken along a line 4—4 of FIG. 5. As shown in the figures, the wiring-side substrate 50 and the element-side substrate 60 are arranged so that the conductor plate 51 of the wiring-side substrate 50 and the conductor plate 71 of the element-side substrate 60 face to each other, and the pads 72a, 72b, 73a, 73b of the element-side substrate 60, and a portion of the conductor plate 71 are electrically connected to the input terminal pad 54a, the gate electrode pad 54b, the drain electrode pad 55b, the output terminal pad 55a, and the source electrode pad layer 57 by the gold bumps 30, respectively. There is a clearance of about 5 μm between the wiring-side substrate 50 and the element-side electrode 60. FIG. 2 is an equivalent circuit diagram of the microwave semiconductor integrated circuit shown in FIG. 1.

Figure 8:
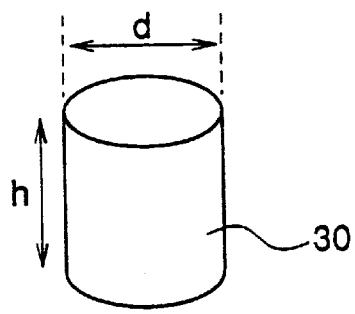
FIGS. 8(a) & 8(b) are diagrams illustrating a structure of a metal bump used in the microwave semiconductor integrated circuit according to the first embodiment.
Figure 8:
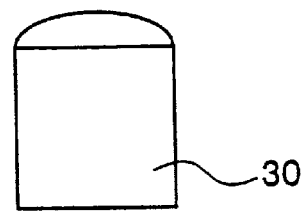

The gold bump 30 is a right circular cylinder some 100 μm in height and diameter as shown in FIG. 8(a), and the inside is wholly filled with gold as shown in FIG. 8(b).

A method for fabricating the microwave semiconductor integrated circuit having the aforesaid structure will be described. Holes are formed in a semiconductor substrate made of GaAs or the like comprising an element such as FET 3 or the like which has been produced on the surface, so that the holes penetrate through the substrate from an element-forming surface to its rear surface. The holes are formed where the gate connecting electrode 4 and drain connecting electrode 5 of the FET 3, the input terminal pad 61, and the output terminal pad 62 are present. The interior surface of the each holes is plated to form via-holes 31. Next, conductor 71 is formed on the rear surface of the substrate including the via-holes 31 by technique such as plating. Ring-shaped clearances 74 having a diameter a little larger than the diameter d of the gold bump 30 are formed at the bottoms of the via-holes 31 below the drain connecting electrode 5 and the gate connecting electrode 4 of the FET 3. Thus, the element-side substrate 60 having the structure shown in FIG. 7 is completed.

Figure 9:
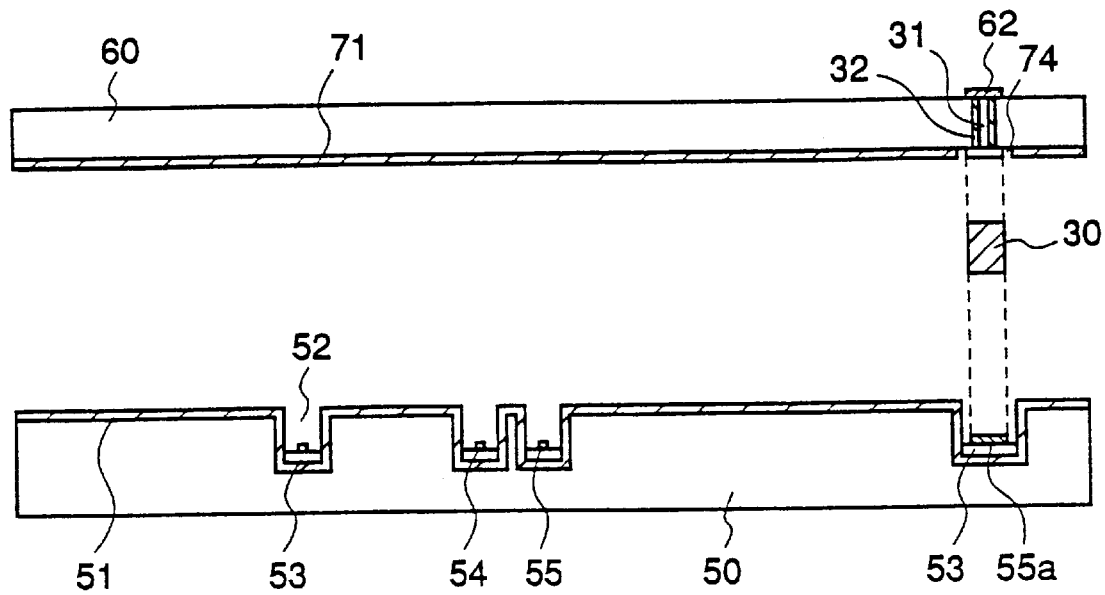
FIG. 9 is a diagram for explaining a method of fabricating a microwave semiconductor integrated circuit according to the first embodiment of the present invention.

The wiring-side substrate is subsequently formed using the conventional method. Initially, the slots for wiring 52 are formed in a substrate made of GaAs or the like by etching or the like. After the conductor plate 51 is formed on the entire surface, the input-side microstrip line 54 and the output-side microstrip line 55 are produced at the bottom surfaces of the slots for wiring 52, on dielectrics 53, as shown in FIG. 9. Then, the wiring-side substrate 50 and the element-side substrate 60 are arranged so that the conductor plate 51 of the wiring-side substrate 50 and the conductor plate 71 of the element-side substrate 60 face each other, and gold bumps 30 are arranged for connecting the pads 72a, 72b, 73a, and 73b of the element-side substrate 60 and the portion of the conductor plate 71, to the input terminal pad 54a, the gate electrode pad 54b, the drain electrode pad 55b, the output terminal pad 55a, and the source electrode pad layer 57 of the wiring-side substrate 50, respectively. The pads 72a, 72b, 73a, and 73b of the substrate 60 and the portion of the conductor plate 71 are electrically connected to the input terminal pad 54a, the gate electrode pad 54b, the drain electrode pad 55b, the output terminal pad 55a, and the source electrode pad layer 57 of the substrate 50 through the gold bumps 30 by holding the wiring-side substrate 50 and the element-side substrate 60 together with gold bumps 30 by pins or applying a conductive adhesive to the front and rear surfaces of the gold bumps 30.

Thus, the microwave semiconductor integrated circuit, according to the first embodiment, comprises the element-side substrate 60 comprising an element such as the FET 3 on the surface and the wiring-side substrate comprising the embedded transmission line 17, and the wiring-side substrate 50 is electrically connected to the element-side substrate 60 by the gold bumps. Therefore, the connection between the transmission line 17 and the connecting electrodes of the element such as the FET 3 or the like can be easily established without being adversely affected by the difference in positional level between the transmission line and the element shown in the prior art device, and the element such as the FET 3 is not damaged by the connection between the transmission lines and the electrodes of the elements, thereby preventing deterioration in reliability of the circuit. In addition, since the element and the transmission line are on separate substrates, focusing can be easily obtained during the exposure for forming the masks for etching the slots and depositing the wiring layers.

Moreover, the element-side substrate 60 is arranged so that its conductor plate 71 is in proximity to the slots for wiring 52 of the wiring-side substrate 50 where the transmission line is formed. As a result, the transmission line comprises the input-side microstrip lines 54 and the output-side microstrip lines 55 which perform as if they were enclosed with a conductor. Therefore, the leakage of electromagnetic waves is inhibited in the longitudinal direction as well as the lateral direction, resulting in transmission lines having high isolation.

Embodiment 2

Figure 11:
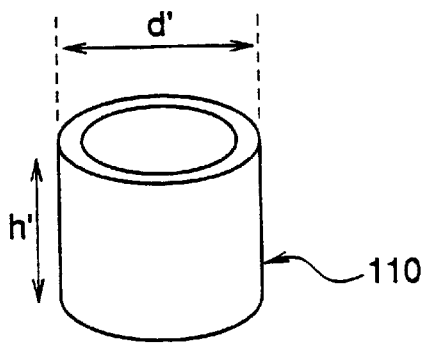
FIGS. 11(a) & 11(b) are diagrams illustrating a structure of a metal bump according to the second embodiment.
Figure 11:
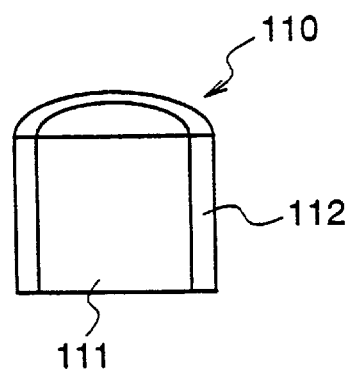

A description is given of a microwave semiconductor integrated circuit in accordance with a second embodiment of the present invention. The structure of the second embodiment is different from that of the first embodiment shown in FIG. 1 in that a semiconductor substrate serving as the element-side substrate is a flip-chip type substrate and that gold bump 110, which comprises a gold line 111 and an insulating film 112 on the side surface of the gold line 111 as shown in FIG. 11, is used as the bump for connecting the element-side substrate and the wiring-side substrate.

Figure 10:
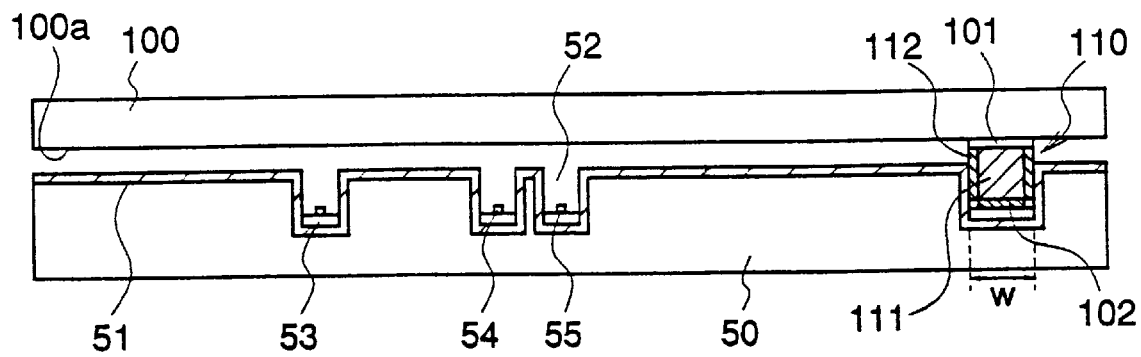
FIG. 10 is a sectional side view illustrating a structure of a microwave semiconductor integrated circuit according to a second embodiment of the present invention.

In the FIG. 10, reference numeral 100 designates a flip-chip including an element such as an FET or the like on a substrate surface 100a, numeral 101 designates a source electrode terminal, and the drain and gate electrodes also have their own terminals on the flip-chip 100. Reference character w designates a width of the bottom surface of the slot for wiring, the bottom surface making contact with the gold bump 111 on a microstrip line serving as an embedded line, and the width w of the bottom surface of the slot for wiring is designed to be approximately equal to the diameter d' of the gold bump 110 shown in FIG. 11.

Figure 12:
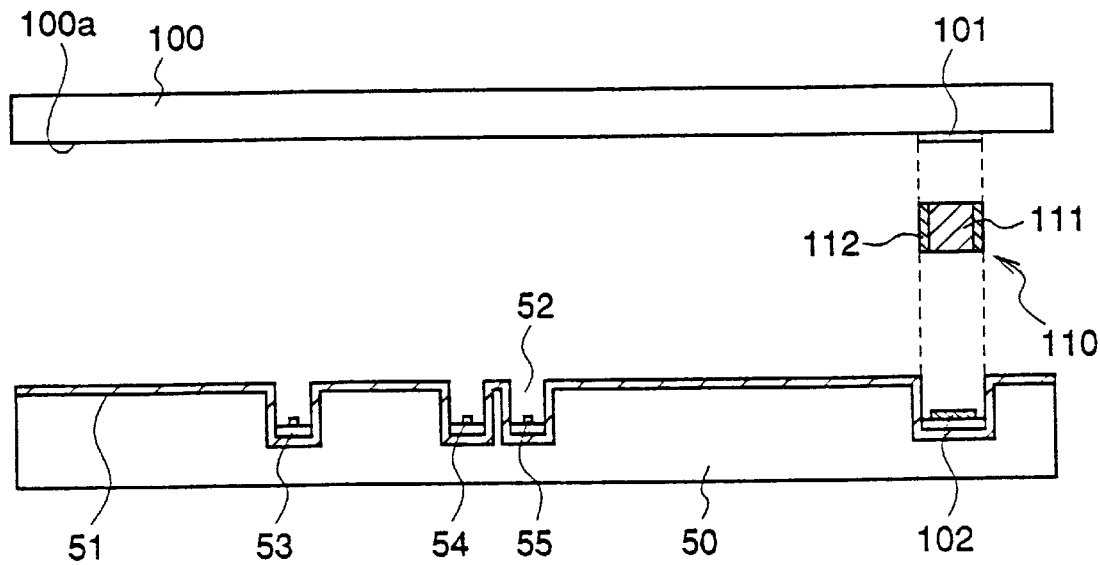
FIG. 12 is a diagram for explaining a method of fabricating a microwave semiconductor integrated circuit according to the second embodiment.

To fabricate the microwave semiconductor integrated circuit having such a structure, as shown in FIG. 12, the substrate surface 100a of the flip-chip type semiconductor substrate 100 having an element such as an FET or the like thereon and the wiring-side substrate 50 including the conductor plate 51 over its substrate surface are placed facing each other. The gold bumps 110 each having the insulating side surface are placed in required positions between the substrates, and the wiring-side substrate and the element-side substrate are crimped together (only the source electrode part is shown in the figure). Thus, the microwave semiconductor integrated circuit is completed.

As described above, according to the second embodiment of the present invention, the width w of the respective bottom surface of the slots for wiring of the wiring-side substrate 50 is designed to be approximately equal to the diameter d' of the gold bump 110 having the insulating film formed over its side surface, and the gold bump 110 is inserted into the slot for wiring. Therefore, since the alignment between the stripline 102 at the bottom surface of the slot for wiring and the gold line 111 is easily effected, and the electrical connection is obtained easily when fabricating the microwave semiconductor integrated circuit comprising the flip-chip type element-side substrate 100 and the wiring-side substrate 50, thereby preventing a short circuit resulting from misalignment.

Embodiment 3

A description is given of a microwave semiconductor integrated circuit according to a third embodiment of the present invention. In the microwave semiconductor integrated circuit of the third embodiment having the structure of the first embodiment shown in FIG. 1, the gold bump with the same structure as that of the gold bump in the second embodiment is used.

Figure 13:
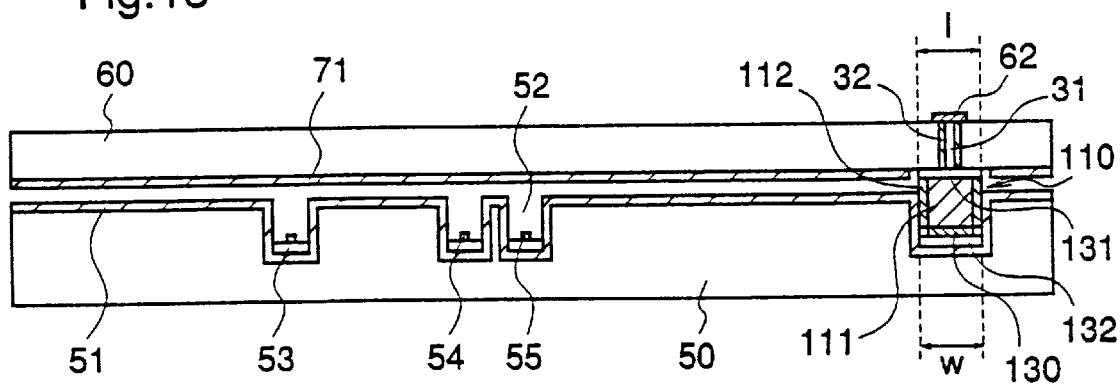
FIG. 13 is a sectional side view illustrating a structure of a microwave semiconductor integrated circuit according to a third embodiment of the present invention.

In FIG. 13, reference numeral 130 designates an output terminal pad in a position on the wiring-side substrate, the position corresponding to the position of the output terminal 62 of the element-side substrate 60 when placing the element-side substrate 60 over the wiring-side substrate 50. The output terminal pad 130 is placed in the slot for wiring of the wiring-side substrate 50 with an interposed insulator 132 with a width w. Reference numeral 131 designates an output terminal pad of the element-side substrate 60 and its width I is designed to be approximately equal to the diameter of the gold bump 110 having the insulating film 112.

Figure 14:
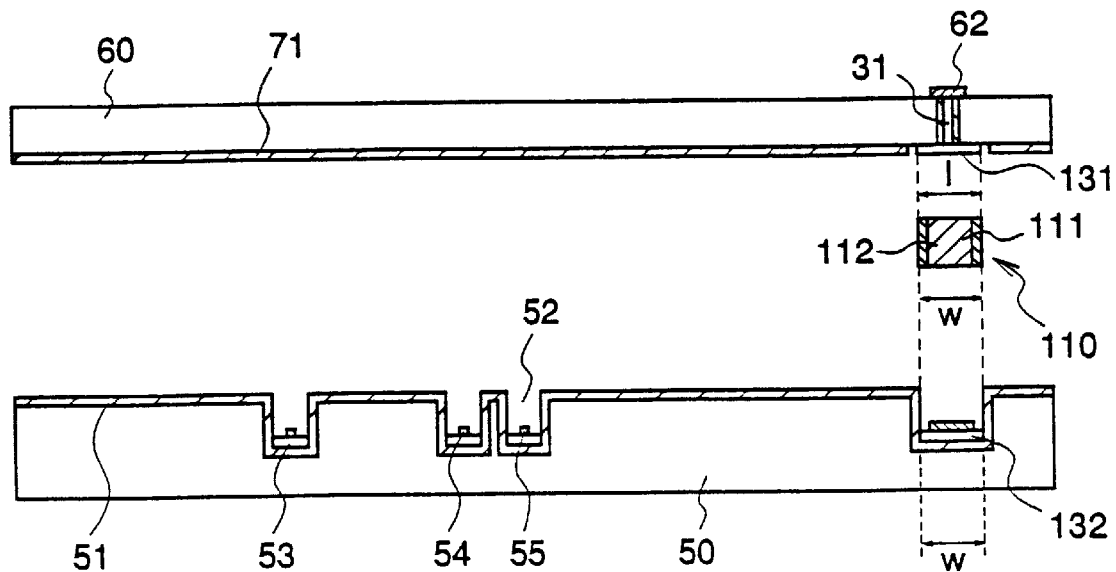
FIG. 14 is a diagram for explaining a method of fabricating a microwave semiconductor integrated circuit according to the third embodiment.

To fabricate the microwave semiconductor integrated circuit having the aforesaid structure, as shown in FIG. 14, a surface of the element-side substrate 60 having an element such as the FET 3 or the like, which substrate has the conductor plate 71 thereon, and a surface of the wiring-side substrate 50 over which the conductor plate 51 is formed are placed facing each other. Then, the gold bumps 110 each having the insulating side surface are placed in required positions between the substrates, and the wiring-side substrate and the element-side substrate are crimped together (only the output pad part is shown in the figure). Thus, the microwave semiconductor integrated circuit is completed.

As described above, according to the third embodiment of the present invention, the width w of the respective bottom surfaces of the respective slots for wiring of the wiring-side substrate 50 is designed to be approximately equal to the diameter d' of the gold bump 110 having the insulating film on the side surface, and the width of the output terminal pad 131 on the element-side substrate 60 also is designed to be approximately equal to the diameter d' of the gold bump 110. Therefore, since alignment between the output terminal pad 130 disposed at the bottom surface of the slot for wiring and the gold line 111 is easily performed, the electrical connection can be established easily when fabricating the microwave semiconductor integrated circuit comprising the element-side substrate 100 and the wiring-side substrate 50, thereby preventing short circuiting resulting from misalignment.

Embodiment 4

A description is given of a microwave semiconductor integrated circuit according to a fourth embodiment of the present invention. In the microwave semiconductor integrated circuit of the fourth embodiment having the structure of the first embodiment shown in FIG. 1, a second wiring-side substrate 152 serving as a passive circuit is provided below the first wiring-side substrate 50 to form a multi-layer wiring structure.

Figure 15:
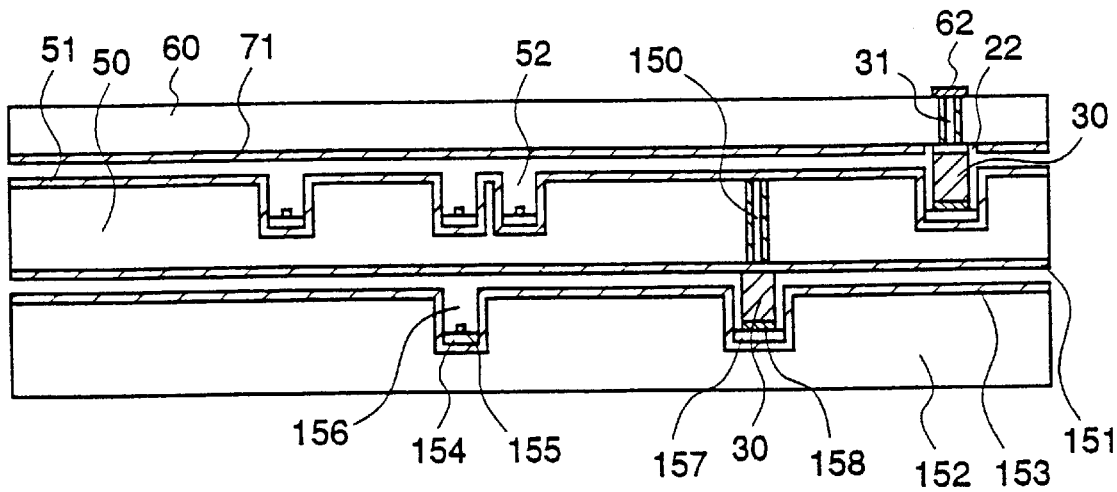
FIG. 15 is a sectional side view illustrating a structure of a microwave semiconductor integrated circuit according to a fourth embodiment of the present invention.

In FIG. 15, reference numeral 150 designates a via-hole extending the first wiring-side substrate 50, and the via-hole 150 connects the conductor plate 51 over the surface of the first wiring-side substrate 50 to the conductor plate 151 on the rear surface thereof. Reference numeral 152 designates a second wiring-side substrate made of, for example, GaAs or the like. A conductor plate 153 is located over a surface of the second wiring-side substrate 152, and a microstrip line 155 is located at a bottom surface of a slot for wiring 156 with an interposed dielectric 154. A pad 158 is also formed in another slot for wiring 156 to establish a connection to a gold bump 30 through a dielectric 157. The gold bump 30 is placed between the first wiring-side substrate 50 and the second wiring-side substrate 152, and establishes the electric connection between the pad 158 and the conductor plate 151.

Thus, according to the fourth embodiment, the conductor plates 51 and 151 are formed on the front and rear surfaces of the first wiring-side substrate 50, respectively, and the conductor plates 51 are electrically connected to the conductor 151 through the via-hole 151. Moreover, the electrical connection between the second wiring-side substrate 152 comprising a transmission line and the first wiring-side substrate 50 is established by the gold bumps 30. Therefore, since the wiring-side substrate has a multi-layer wiring structure, the flexibility in circuit design is increased. In addition, the multi-layer structure allows chip size reduction without changing the length of the wiring.

Embodiment 5

A description is given of a microwave semiconductor integrated circuit in accordance with a fifth embodiment of the present invention. In the fifth embodiment, the wiring-side substrate is fabricated by assembling parts in place of using conventional wafer processing techniques such as etching.

Figure 16:
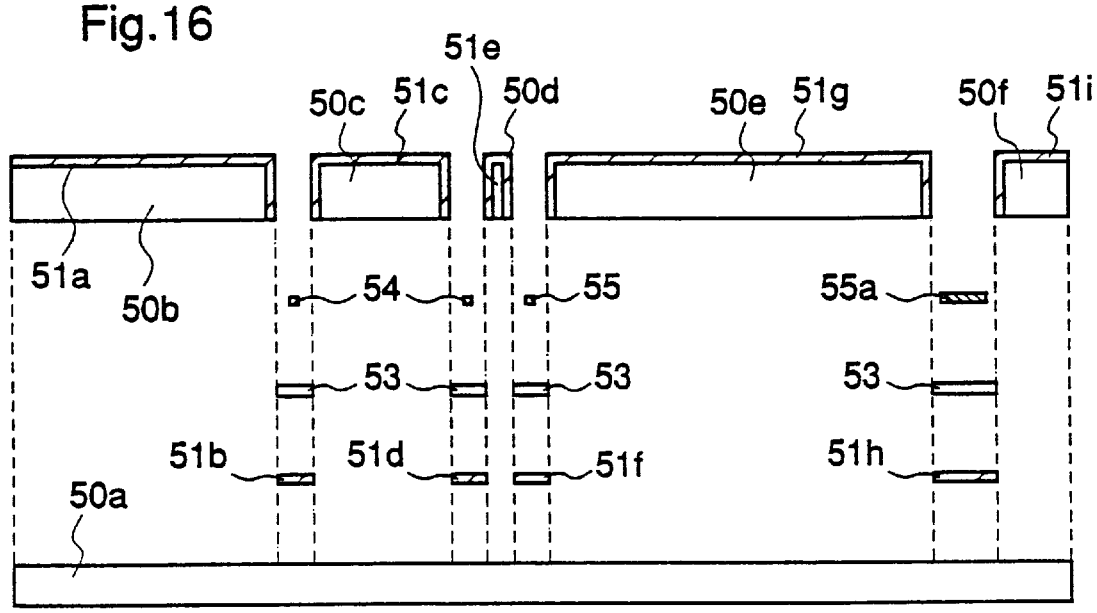
FIG. 16 is a diagram for explaining a method of fabricating a microwave semiconductor integrated circuit according to a fifth embodiment of the present invention.

For example, the wiring-side substrate 50 having the structure shown in FIG. 3 is formed in the following procedure as shown in FIG. 16. Initially, an adhesive is applied over a surface of a ground substrate 50*a* made of GaAs or the like. Then, split substrates 50*b*, 50*c*, 50*d*, 50*e*, and 50*f* made of GaAs or the like, which comprise conductor plates 51*a*, 51*c*, 51*e*, 51*g*, and 51*i* on their front surfaces, respectively, are bonded to the surface of the ground substrate 50*a* in prescribed positions, and conductor plates 51*b*, 51*d*, 51*f*, and 51*h* are bonded in resultant slot areas, respectively. Then, input-side microstrip line 54 and output-side microstrip line 55 (including an output terminal pad 55*a*) are bonded on the conductor plates 51*b*, 51*d*, 51*f*, and 51*h* with interposed dielectrics 53 by the adhesive. Thus, the wiring-side substrate is completed.

As described above, a desired wiring-side substrate comprising a transmission line is obtained by depositing the respective parts on the ground substrate 50*a*. When using a conductive adhesive applied over the surface of the ground substrate 50*a*, the conductor plates 51*a*, 51*c*, 51*e*, 51*g*, and 51*i* bonded to the split substrates are electrically connected to the conductor plates 51*b*, 51*d*, 51*f*, and 51*h* which are formed beneath the dielectrics 53 with further reliability, and the same effect is achieved when the conductive adhesive is used for bonding the dielectrics 53. However, care should be taken to prevent the excessive conductive adhesive from adhering to the side surfaces of the microstrip lines 54 and 55 (including the output terminal pad 55*a*) when these microstrip lines 54 and 55 are bonded on the dielectrics 53.

Thus, according to the fifth embodiment, the wiring-side substrate is formed by applying an adhesive over the surface of the ground substrate 50*a* and bonding the split substrates 50*b*, 50*c*, 50*d*, 50*e*, and 50*f* to the ground substrate 50*a*, bonding the conductor plates 51*b*, 51*d*, 51*f*, and 51*h* in the resultant slot areas, and bonding the inputside microstrip line 54 and the output-side microstrip line 55 (including the output terminal pad 55a) on the aforesaid conductor plates 51b, 51d, 51f, and 51h with interposed dielectrics 53. As a result, the wiring-side substrate can be fabricated mechanically without using conventional wafer processing, and an embedded transmission line can be fabricated with ease.

Embodiment 6

Figure 17:
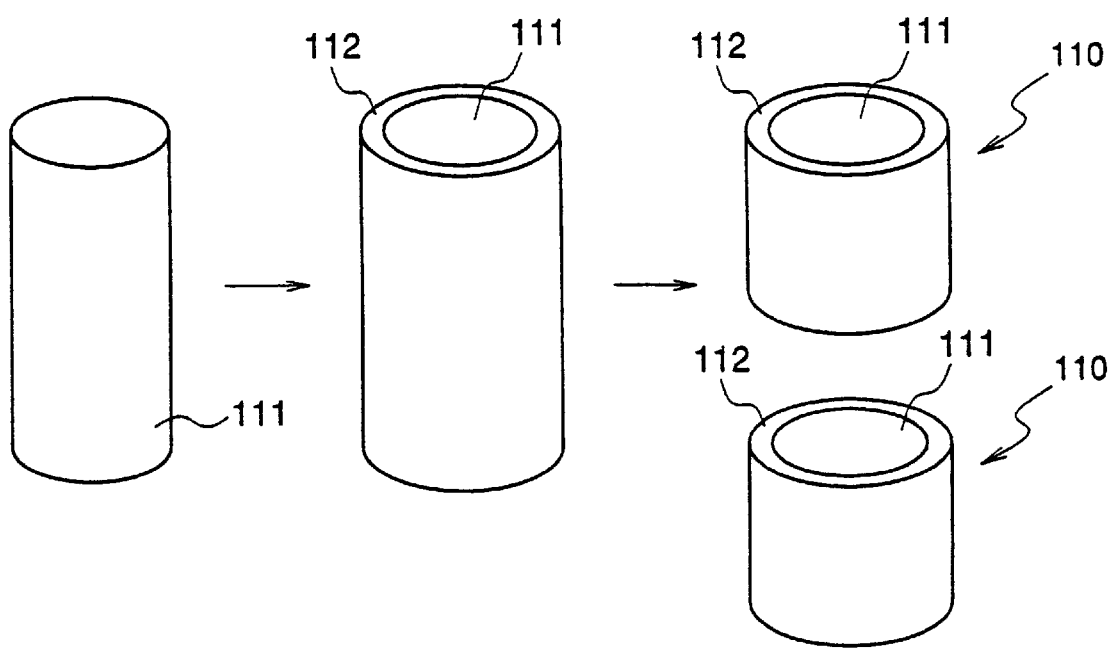
FIG. 17 is a diagram for explaining a method of fabricating a gold bump in accordance with a method of fabricating a microwave semiconductor integrated circuit according to a sixth embodiment of the present invention.
Figure 18:
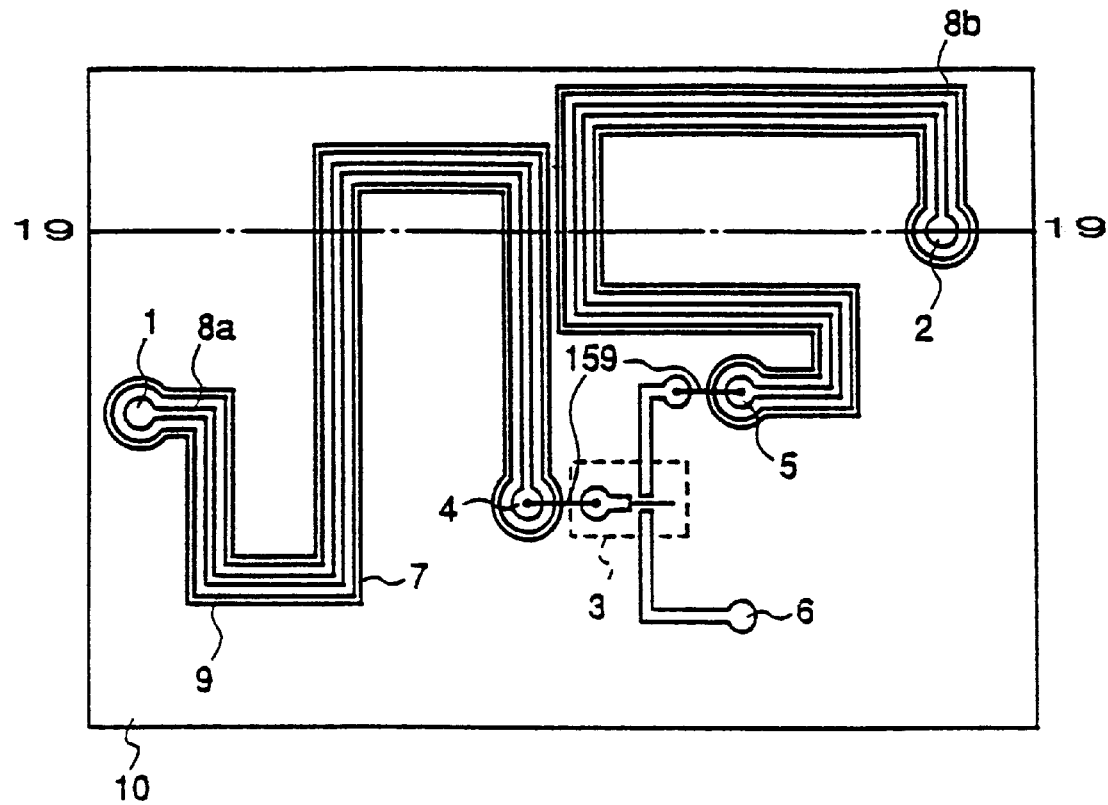
FIG. 18 is a plan view illustrating a structure of a prior art microwave semiconductor integrated circuit comprising an embedded line.
Figure 19:
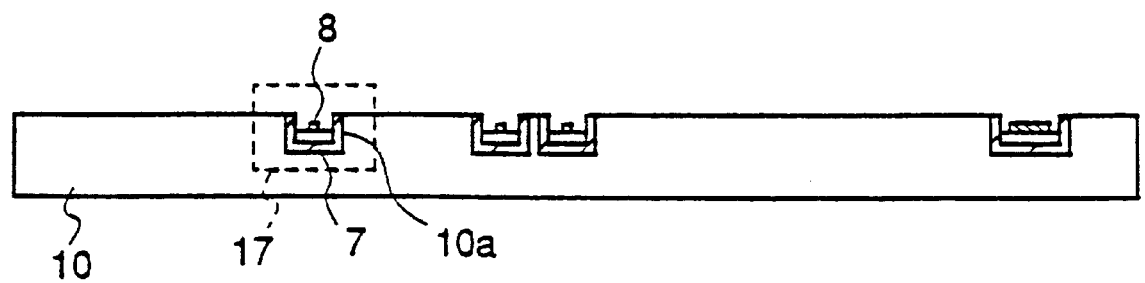
FIG. 19 is a sectional side view of the prior art microwave semiconductor integrated circuit taken along the line 19—19 of FIG. 18.

A description is given of a microwave semiconductor integrated circuit according to a sixth embodiment of the present invention. In the sixth embodiment, the gold bump having an insulated side surface is easily fabricated, as shown in FIG. 17.

Initially, a gold rod 111 is introduced into an atmosphere suitable for fabrication of vinyl, nylon, or the like. Then, the side surface of the gold rod 111 is uniformly coated with an organic insulating film of prescribed thickness by adjusting its residence time in the atmosphere to form an insulating film 112 surrounding the gold rod 111. The resultant gold bump 110 is cut into parts of prescribed length by means of a cutter which applies stress to an object to be cut from its perimeter toward the center. At this point, care should be taken not to generate burrs at cut surfaces. As a result, a plurality of gold bumps 110 each having an insulating film 112 on the side surface can be achieved.

While in each of the aforesaid embodiments a dielectric made of GaAs or the like serves as a wiring-side substrate, a conductor comprising gold or the like can also be used in place of the dielectric and, in this case, an advantage is achieved in that the thermal dissipation effect of the wiring-side substrate is increased.

Moreover, it is apparent that the gold bump used in the second embodiment can be used in place of the gold bump 110 used in the other embodiments.

In addition, the multi-layer structure described in the fourth embodiment is applicable to the other embodiments.

What is claimed is:

1. A microwave semiconductor integrated circuit comprising:

a wiring-side substrate having opposed first and second surfaces, grooves in the first surface, a transmission line located in the grooves, and a first conductor covering the first surface but not the grooves;

an element-side substrate having first and second opposed surfaces, a second conductor on the second surface of the element-side substrate, an active element with electrodes on the first surface of the element-side substrate, and via-holes electrically connecting the electrodes of the active element to the second conductor; and metal bumps electrically connecting the transmission line of the wiring-side substrate to the electrodes of the active element on the element-side substrate through the via-holes of the element-side substrate, with the second surface of the element-side substrate and the first surface of the wiring-side substrate facing each other.

2. The microwave integrated circuit of claim 1 wherein the wiring-side substrate includes a plurality of split substrates with surfaces and having conductors on the surfaces on a ground substrate, and bonded conductors, dielectrics, and wiring layers serving as microstrip lines in slots between adjacent split substrates.

3. The microwave semiconductor integrated circuit of claim 1 wherein the wiring-side substrate comprises a metal conductor.

4. A microwave semiconductor integrated circuit comprising:

a wiring-side substrate having first and second opposed surfaces, grooves in the first surface, and a transmission line located in the grooves;

an element-side substrate having opposed first and second surfaces and an active element with electrodes on the first surface of the element-side substrate; and metal bumps electrically connecting the transmission line of the wiring-side substrate to the electrodes of the active element on the element-side substrate wherein each of the metal bumps comprises an insulating layer covering a side surface of the metal bump.

5. The microwave semiconductor integrated circuit of claim 4 wherein each of the metal bumps having the insulating layer has a diameter approximately equal to a width of the grooves, and the metal bumps are disposed in the grooves to establish electrical connections to the transmission line.

6. The microwave semiconductor integrated circuit of claim 4 wherein each of the metal bumps having the insulating layer comprises a metal portion having a diameter approximately equal to a width of the electrodes of the active element.

7. A microwave semiconductor integrated circuit including:

an element-side substrate having opposed first and second surfaces, an active element with electrodes on the first surface, first via-holes electrically connecting the electrodes of the active element to the second surface, and a first conductor on the second surface;

a first wiring-side substrate having opposed first and second surfaces, grooves in the first surface of the first wiring-side substrate, a first transmission line located in the grooves, a second conductor covering the first surface of the first wiring-side substrate but not the grooves, a third conductor covering the second surface of the first wiring-side substrate, and second via-holes electrically connecting the second and third conductors, the first surface of the first wiring-side substrate facing the second surface of the element-side substrate;

first metal bumps electrically connecting the first transmission line of the first wiring-side substrate to the electrodes of the active element on the element-side substrate through the first via-holes;

a second wiring-side substrate, the first wiring-side substrate being interposed between the second wiring-side substrate and the element-side substrate, the second wiring-side substrate comprising a surface including grooves, a conductor disposed on the surface of the second wiring-side substrate, opposite the second surface of the first wiring-side substrate and a second transmission line located in the grooves of the second wiring-side substrate; and, second metal bumps electrically connecting the second transmission line of the second wiring-side substrate to the third conductor on the second side of the first wiring-side substrate.

* * * * *